United States Patent
Buckner et al.

(10) Patent No.: US 8,222,868 B2
(45) Date of Patent: Jul. 17, 2012

(54) BATTERY TESTER FOR RECHARGEABLE POWER TOOL BATTERIES

(75) Inventors: Michael E. Buckner, Central, SC (US); Daniel B. Nelson, Anderson, SC (US); Samuel Boyles, Easley, SC (US); Umesh Jairamdas Rajani, Anderson, SC (US); Anthony Thomas Tocco, Easley, SC (US)

(73) Assignee: Techtronic Power Tools Technology Limited, Tortola (BV)

( * ) Notice: Subject to any disclaimer, the term of this patent is extended or adjusted under 35 U.S.C. 154(b) by 1141 days.

(21) Appl. No.: 12/061,380

(22) Filed: Apr. 2, 2008

(65) Prior Publication Data

US 2009/0251149 A1 Oct. 8, 2009

(51) Int. Cl.
*H02J 7/00* (2006.01)
*G01N 27/416* (2006.01)

(52) U.S. Cl. ........................................ 320/136; 426/433
(58) Field of Classification Search .................. 320/107, 320/112, 127, 135, 136; 324/426, 429, 433, 324/434
See application file for complete search history.

(56) References Cited

U.S. PATENT DOCUMENTS

| | | | |
|---|---|---|---|
| 3,185,921 A | 5/1965 | Sumter | |
| 3,974,441 A | 8/1976 | Van Den Haak | |
| 4,106,725 A | 8/1978 | Richt | |
| 4,147,969 A | 4/1979 | Miller et al. | |
| 4,237,198 A | 12/1980 | Eby et al. | |
| 4,248,942 A | 2/1981 | Eby et al. | |
| 4,321,541 A | 3/1982 | Nishizuka | |
| 4,389,609 A | 6/1983 | Kawamura | |
| D278,212 S * | 4/1985 | Schwartz | ...................... D10/77 |
| 4,514,695 A | 4/1985 | Lau | |
| 4,625,174 A | 11/1986 | Eberhart | |
| 4,626,765 A | 12/1986 | Tanaka | |
| 4,659,994 A | 4/1987 | Poljak | |
| 4,725,784 A | 2/1988 | Peled et al. | |

(Continued)

FOREIGN PATENT DOCUMENTS

BE 1009151 12/1996

(Continued)

OTHER PUBLICATIONS

European Search and Opinion Report, Application No. 08253021.3, dated Dec. 14, 2010 (8 pages).

*Primary Examiner* — Richard V Muralidar
(74) *Attorney, Agent, or Firm* — Michael Best & Friedrich LLP (57) ABSTRACT

A battery tester engages a power tool battery and includes a housing having a cavity for receiving a stem of the power tool battery. The battery tester has a plurality of electrically conductive contacts disposed in the cavity and is configured to engage corresponding battery electrodes on the stem. A processor is mounted within the housing and communicates with the battery through the electrically conductive contacts. The processor measures a voltage level of the battery, and a loading circuit electrically loads the battery during measuring. One or more indicators are controlled by the processor. The processor activates the loading circuit for a predetermined period of time to measure a voltage level of the battery while under load, and then activates the indicators to provide a visual indication of remaining battery life. The battery tester is a stand-alone device where housing does not have a motor or a battery charger.

26 Claims, 9 Drawing Sheets

U.S. PATENT DOCUMENTS

| | | | |
|---|---|---|---|
| 4,743,855 A | 5/1988 | Randin et al. | |
| 4,861,685 A | 8/1989 | Tien et al. | |
| 4,876,632 A | 10/1989 | Osterhout et al. | |
| 5,028,858 A | 7/1991 | Schnizler et al. | |
| 5,099,210 A | 3/1992 | Fortney et al. | |
| 5,105,180 A | 4/1992 | Yamada et al. | |
| 5,126,675 A | 6/1992 | Yang | |
| 5,130,658 A | 7/1992 | Bohmer | |
| 5,159,272 A | 10/1992 | Rao et al. | |
| 5,181,859 A | 1/1993 | Foreman et al. | |
| 5,196,779 A | 3/1993 | Alexandres et al. | |
| 5,216,371 A | 6/1993 | Nagai | |
| 5,248,927 A | 9/1993 | Takei et al. | |
| 5,290,191 A | 3/1994 | Foreman et al. | |
| 5,293,156 A | 3/1994 | Shoji et al. | |
| 5,308,715 A | 5/1994 | Aronne | |
| 5,339,024 A | 8/1994 | Kuo et al. | |
| 5,369,364 A | 11/1994 | Renirie et al. | |
| 5,376,887 A | 12/1994 | Saubolle | |
| 5,483,165 A | 1/1996 | Cameron et al. | |
| 5,496,658 A | 3/1996 | Hein et al. | |
| 5,518,835 A | 5/1996 | Simmonds | |
| 5,519,383 A | 5/1996 | De La Rosa | |
| 5,525,890 A | 6/1996 | Iwatsu et al. | |
| 5,550,475 A | 8/1996 | Shafer | |
| 5,590,058 A | 12/1996 | Foreman et al. | |
| 5,596,278 A | 1/1997 | Lin | |
| 5,606,243 A | 2/1997 | Sakai et al. | |
| 5,614,807 A | 3/1997 | Duley | |
| 5,627,472 A | 5/1997 | Ofer et al. | |
| 5,656,919 A | 8/1997 | Proctor et al. | |
| 5,717,308 A | 2/1998 | Nishitani et al. | |
| 5,726,556 A | 3/1998 | Yoshihara et al. | |
| 5,783,998 A | 7/1998 | Nakajou et al. | |
| 5,805,069 A | 9/1998 | Mitsui et al. | |
| 5,894,222 A | 4/1999 | Hibino | |
| 5,895,440 A | 4/1999 | Proctor et al. | |
| 5,898,290 A | 4/1999 | Beard et al. | |
| 5,926,008 A | 7/1999 | Palanisamy et al. | |
| 5,949,219 A | 9/1999 | Weiss | |
| 6,045,941 A | 4/2000 | Milewits | |
| 6,049,210 A | 4/2000 | Hwang | |
| 6,064,182 A | 5/2000 | Eguchi | |
| 6,069,468 A | 5/2000 | Sonobe | |
| 6,072,299 A | 6/2000 | Kurle et al. | |
| 6,075,343 A | 6/2000 | Hsu | |
| 6,121,753 A | 9/2000 | Walker et al. | |
| 6,121,755 A | 9/2000 | Nowak et al. | |
| 6,137,261 A | 10/2000 | Kurle et al. | |
| 6,154,033 A | 11/2000 | Palanisamy et al. | |
| 6,157,169 A | 12/2000 | Lee | |
| 6,163,132 A | 12/2000 | Higuchi et al. | |
| 6,191,551 B1 | 2/2001 | Fischer et al. | |
| 6,191,557 B1 | 2/2001 | Gray et al. | |
| D442,100 S * | 5/2001 | Blair et al. | D10/77 |
| 6,304,060 B1 | 10/2001 | Dernehl | |
| 6,369,577 B1 | 4/2002 | Cho | |
| 6,384,607 B2 | 5/2002 | Horie et al. | |
| 6,483,274 B2 | 11/2002 | Lee | |
| 6,586,940 B2 | 7/2003 | Asakura et al. | |
| 6,950,030 B2 | 9/2005 | Kovarik et al. | |
| 6,955,864 B1 | 10/2005 | Vaisnys et al. | |
| 7,012,433 B2 | 3/2006 | Smith et al. | |
| 7,038,425 B2 | 5/2006 | Chuang | |
| 7,064,522 B2 | 6/2006 | Nawa et al. | |
| 7,176,656 B2 * | 2/2007 | Feldmann | 320/114 |
| 7,227,335 B2 | 6/2007 | Sakakibara et al. | |
| 2004/0046673 A1 | 3/2004 | Kovarik et al. | |
| 2007/0108944 A1 | 5/2007 | Pellenc | |

FOREIGN PATENT DOCUMENTS

| | | |
|---|---|---|
| EP | 1100170 | 5/2001 |
| GB | 2298719 | 9/1996 |
| JP | 2121280 | 5/1990 |
| JP | 2004184139 | 7/2004 |

* cited by examiner

BATTERY TESTER FOR RECHARGEABLE POWER TOOL BATTERIES

BACKGROUND

This disclosure relates to a device for testing batteries. In particular, this disclosure relates to a battery tester for testing power tool batteries.

Cordless power tools generally use batteries that are rated at 9.6 volts, 14.4 volts, 18 volts, or 24 volts. Often, a user may have several batteries that can fit or be used with the same power tool. When the user has several batteries in the field, it is helpful to be able to determine which of the batteries are charged, and to what degree.

Battery testers exist in various forms. Analog and/or digital voltmeters (DVMs) typically have two long wires or leads with metal probes at each end. The user touches the probes to an electrical source, such as a battery or battery terminals, to measure the battery voltage. Based on the user's analysis of the measured battery voltage relative to the maximum expected battery voltage, the user may infer the amount of remaining battery life.

However, this process is physically cumbersome because the user must maneuver the probes to make electrical contact, while at the same time adjusting the knobs on the meter. This is certainly not a one-handed operation. In some circumstances, two people may be needed to perform the task. While this may provide an indication of the actual voltage level, some level of technical sophistication is required to determine the meaning of the measured voltage. For example, if a fully charged battery has a voltage of 14.2 volts, what does a measured voltage level of 10 volts mean? The user must be able to correlate the measured voltage relative to the maximum expected voltage and arrive at a value representing the remaining battery life.

Some battery testers are in the form of a box with a plurality of slots or cradles. The slots are configured to receive small batteries, such as D-cell batteries, C-cell batteries, AA-cell batteries, and AAA-cell batteries. The battery is placed in the slot between two metal contacts, and a meter or display provides an indication whether the battery is good, bad, or somewhere in between. However, such testing boxes are relatively large and cumbersome, and are not adapted to testing power tool batteries. It is often difficult to remove the battery from the slot once inserted.

Accordingly, a battery tester for a power tool battery is needed that provides the user with an indication of remaining battery life, and which can easily and conveniently engage and disengage the power tool battery.

SUMMARY

According to one specific embodiment, a battery tester engages a power tool battery, and includes a housing having a cavity for receiving a stem of the power tool battery and a plurality of electrically conductive contacts disposed in the cavity configured to engage corresponding battery electrodes on the stem. A processor is mounted within the housing and communicates with the battery through the electrically conductive contacts. The processor measures a voltage level of the battery, and a loading circuit electrically loads the battery during measuring. One or more indicators disposed on or in the housing are controlled by the processor. The processor activates the loading circuit for a predetermined period of time to measure a voltage level of the battery while under load, and then activates the indicators to provide a visual indication of remaining battery life. The battery tester is a stand-alone device where housing does not have a motor or a battery charger.

According to another specific embodiment, a stand-alone battery tester engages a slide-type power tool battery. The battery tester includes a housing having a connector configured to slidingly receive battery terminals of the slide-type power tool battery, and a plurality of electrically conductive contacts disposed in the connector configured to biasingly engage the corresponding battery terminals. A processor is mounted within the housing and communicates with the battery through the electrically conductive contacts. The processor measures a voltage level of the battery, and a loading circuit electrically loads the battery during measuring. One or more indicators disposed on or in the housing are controlled by the processor. The processor activates the loading circuit for a predetermined period of time to measure a voltage level of the battery while under load, and then activates the indicators to provide a visual indication of remaining battery life. The battery tester is a stand-alone device where housing does not have a motor or a battery charger.

According to another specific embodiment, the battery tester further includes a voltage divider configured to provide a scaled voltage signal to an input of the processor, where the scaled voltage signal corresponds to remaining battery life. The processor activates the loading circuit for a first predetermined period of time to measure a voltage level of the battery while under load, and then activates the indicators to provide a visual indication of remaining battery life. The indicators are then deactivated after a second predetermined period of time. The battery tester is a stand-alone device where housing does not have a motor or a battery charger.

According to another specific embodiment, a battery testing circuit includes a processor having an input configured to receive a battery voltage level, and a regulated power supply configured to provide regulated power to the processor. A loading switch is operatively coupled to the processor, and a load is coupled between the battery and the switch. The processor activates the loading switch for a predetermined period of time to operatively couple the load between the battery and ground so as to load the battery. The processor measures a voltage level of the battery while under load and activates indicators disposed on the housing to provide a visual indication of remaining battery life.

DETAILED DESCRIPTION OF EMBODIMENTS

The invention is described with reference to the drawings in which like elements are referred to by like numerals. The relationship and function of the various elements of this invention are better understood by the following description. Each aspect so defined may be combined with any other aspect or aspects unless clearly indicated to the contrary. The embodiments described below are by way of example only, and the invention is not limited to the embodiments illustrated in the drawings.

Figure 1:
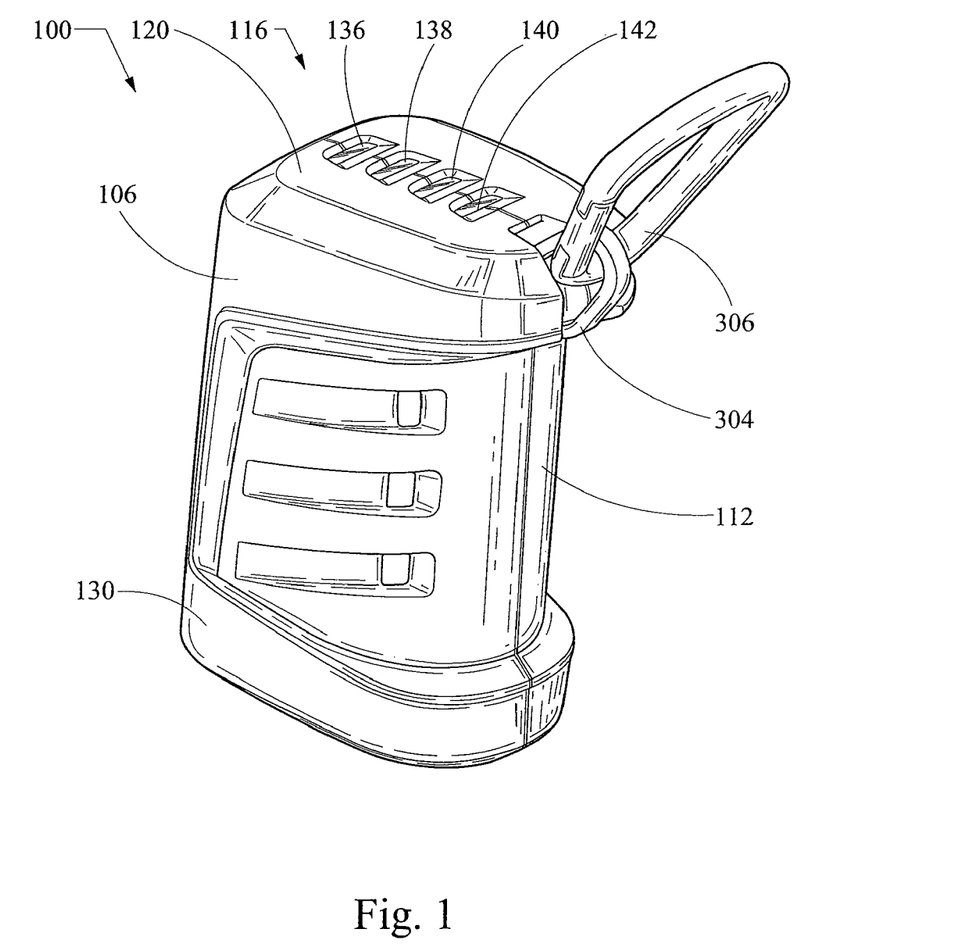
FIG. 1 is a perspective view of a battery tester according to one specific embodiment.

FIG. 1 is a perspective view of a battery tester 100. The battery tester 100 includes a housing 106 having a contoured grip portion 112 for user-convenience and ergonomic considerations. The housing 106 may be formed of plastic or other suitable material. A plurality of light-emitting diodes (LEDs) 116 may be provided on or in a surface portion 120 of the battery tester housing 106. The LEDs 116 may be placed in any convenient position on the battery tester 100, such as on the top surface 120 or a side surface 130. The LEDs 116 may be recessed as shown in the illustrated embodiment. The LEDs 116 may also be flush with the surface 120 of the housing 106, or they may protrude relative to a surface of the housing. The LEDs 116 may indicate the remaining charge of the battery.

In one specific embodiment, the housing 106 may include four separate LEDs 116, such as, for example, a green LED 136, a blue LED 138, a yellow LED 140, and a red LED 142. Any suitable number and colors of LEDs 116 may be used depending on the application. The LEDs 116 may provide the user with a visual indication of the remaining battery charge depending on which of the LEDs or combination of LEDs is illuminated. Other suitable visual displays may be included, such as an LCD display that displays a bar chart, alphanumeric characters, graphic characters, or other indicia of battery life. In some embodiments, an audio indicator may provide an audio indication of the remaining battery life. For example, an audio transducer, such as a speaker, piezoelectric transducer, or other transducer, may emit a series of audio "beeps" or tones corresponding to the measured battery life. Various tones may correspond to the battery life level.

Figure 2:
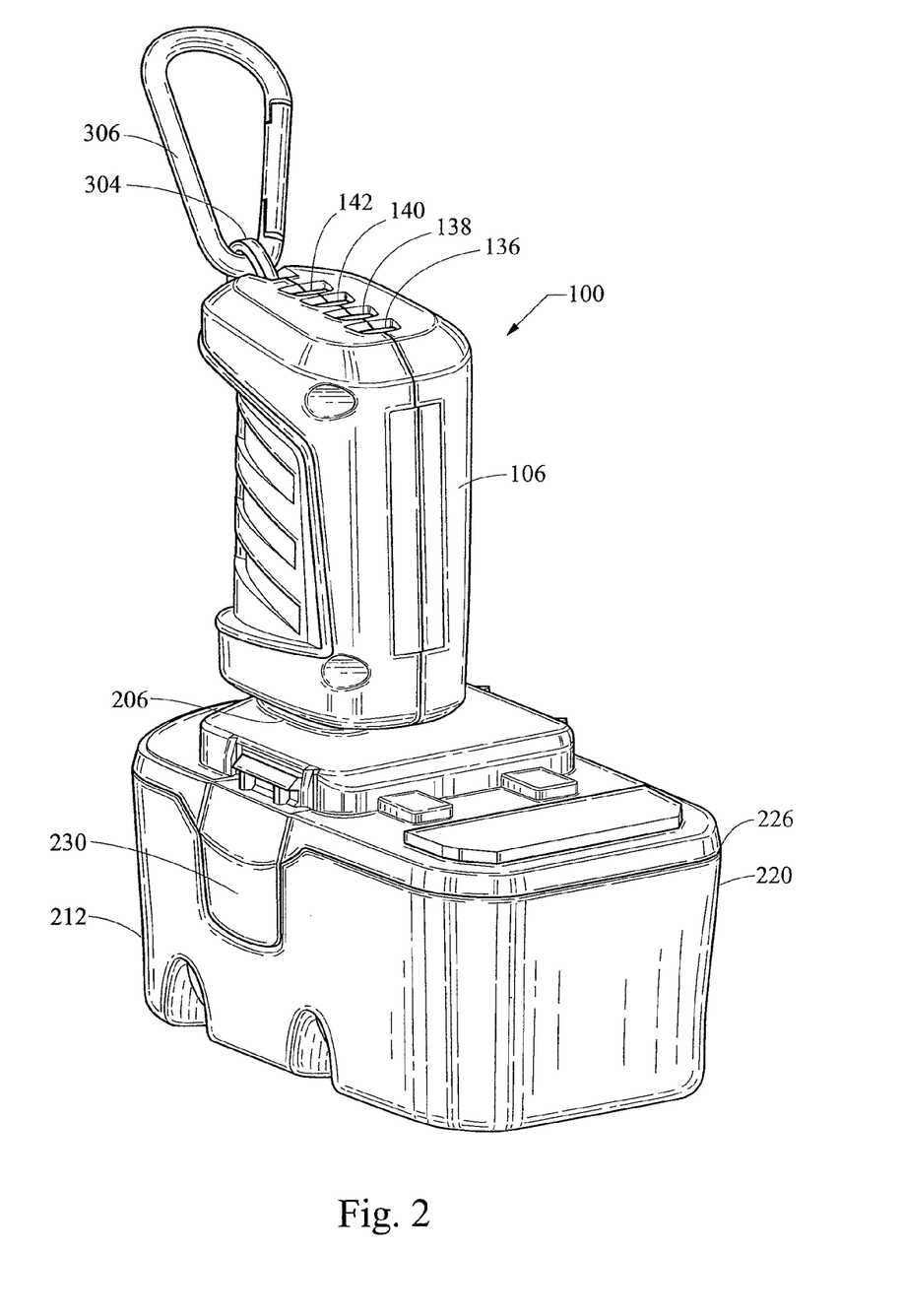
FIG. 2 is a perspective view of a battery tester and a power tool battery according to one specific embodiment.
Figure 3:
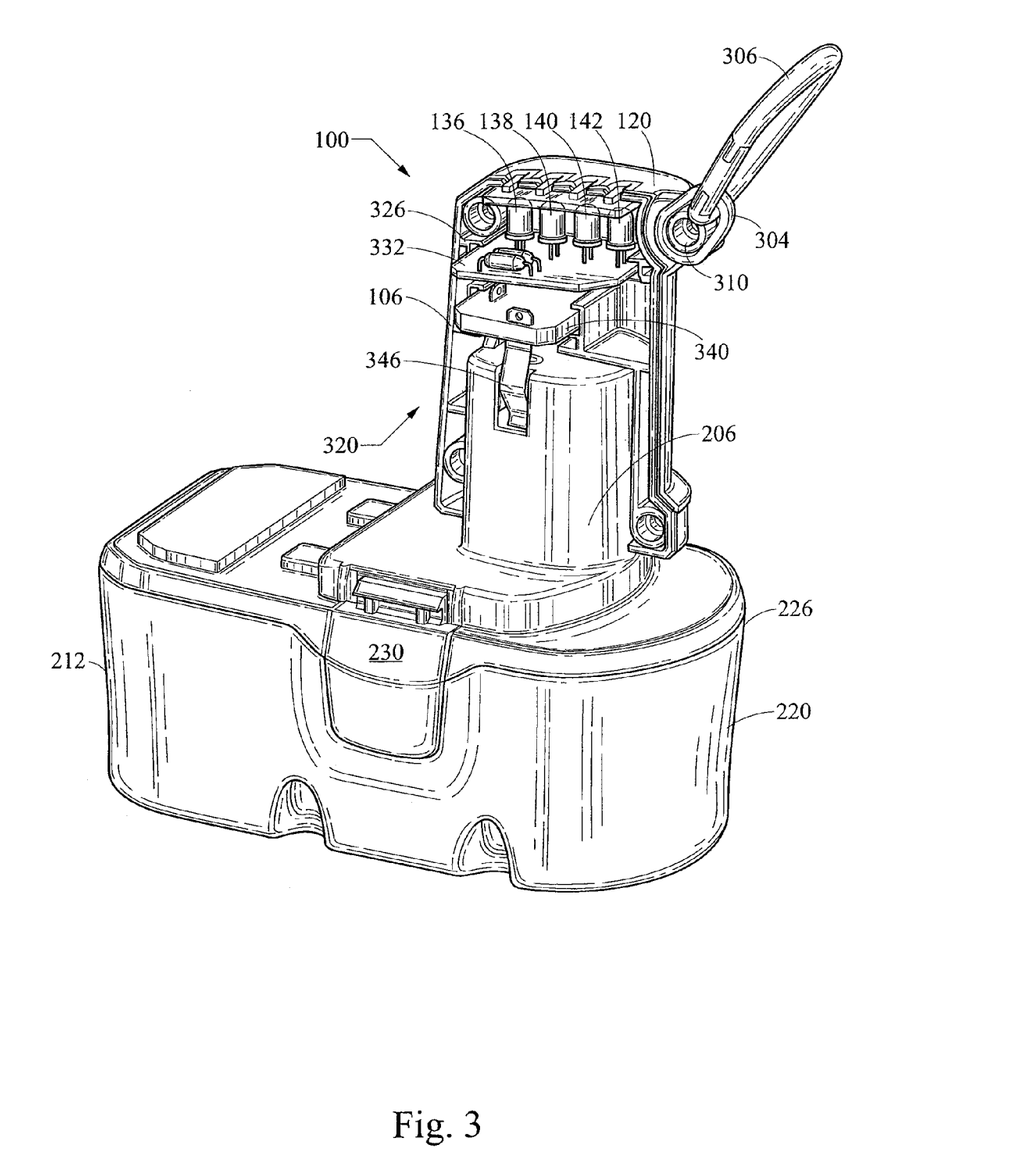
FIG. 3 is a partial sectional view of the battery tester shown engaging a stem of the power tool battery according to one specific embodiment.

FIG. 2 shows the battery tester 100 in operation in a position engaging a stem 206 of the power tool battery 212, while FIG. 3 shows the battery tester 100 in partial sectional view engaging the battery stem 206. The power tool battery 212 may be a commercially available power tool battery, such as a nickel-cadmium or a lithium-ion power tool battery. The power tool battery 212 includes a housing 220 having a base 226, and the stem 206 projecting from the base. The housing 220 may be formed of plastic or other suitable material. The base 226 may include two laterally opposed spring-loaded side clips 230 configured to engage corresponding tabs in the power tool (not shown) to which it attaches so as to lock the battery 212 to the power tool. The stem 206 may include two electrodes partially recessed relative to an outside periphery of the stem. The two electrodes may provide positive and negative battery contact. A third stem electrode, which may also be partially recessed, may provide battery identification (nickel-cadmium v. lithium-ion).

FIG. 3 shows a partial sectional view of the battery tester 100 shown engaging the stem 206 of the power tool battery 212 according to one specific embodiment. The battery tester 100 may be releasably connected to a loop 304, which may in turn, be connected to a ring 306, a key chain or fob, or carabineer-type connector to permit the battery tester to be easily and conveniently affixed to a support or carrier, such as a belt loop, handle of a carrying case, or other fixed or temporary structure. The loop 304 may engage a circular spindle 310 or boss formed in the housing 106, and may swivel or rotate around the spindle.

The housing 106 may be formed with an interior cavity 320 that may have a contour that generally corresponds to the outside contour of the battery stem 206. The cavity may be configured to receive the battery stem 206, as shown in FIG. 3. An internal portion or structure 326 within the battery tester housing 106 is configured to support a circuit board 332, such as a printed circuit board. The circuit board 332 may support and interconnect various electrical components ("the circuit") to facilitate battery testing, as described below. An electrode clip holder 340 may be formed of plastic or other non-conducting material, and may be mounted in an upper portion of the battery tester 100, or may be integrally formed with the housing 106. The electrode clip holder 340 may include a plurality of flexible electrode clips or contacts 346 configured to engage the corresponding stem electrodes.

Once the electrode clips 346 engage the battery electrodes, the circuit is energized and the battery tester operation begins. No mechanical switch or micro-switch is used to activate the circuitry or trigger measurement of remaining battery life. Such mechanical switches may be prone to failure. Once the battery tester 100 engages the battery 212, the battery is electrically "loaded" for a predetermined period of time of about one to about five seconds (described below). During that time, the battery condition (voltage level) is measured. After the voltage level has been measured, and the LEDs 116 are illuminated to provide the user with an indication of battery life.

In operation, the battery tester 100 is placed over the battery stem 206. The battery tester 100 does not engage the side clips 230 of the battery housing 106. Rather, a gentle frictional fit permits the battery tester 106 to engage the battery stem 206 and make positive electrical contact with the stem electrodes. The amount of friction is sufficient to maintain electrical continuity, while permitting single-handed operation. Accordingly, the battery tester 100 may be placed over the battery stem 206 and removed from the stem with a single hand. For example, if the battery 212 is resting on a fixed surface with the battery tester 100 engaged, the battery tester may be removed from the battery stem 206 without "lifting" the battery from the fixed surface. In other words, the amount frictional force between the battery tester 100 (or electrode clips) and the battery stem 206 is less than the weight of the power tool battery 212.

Figure 4:
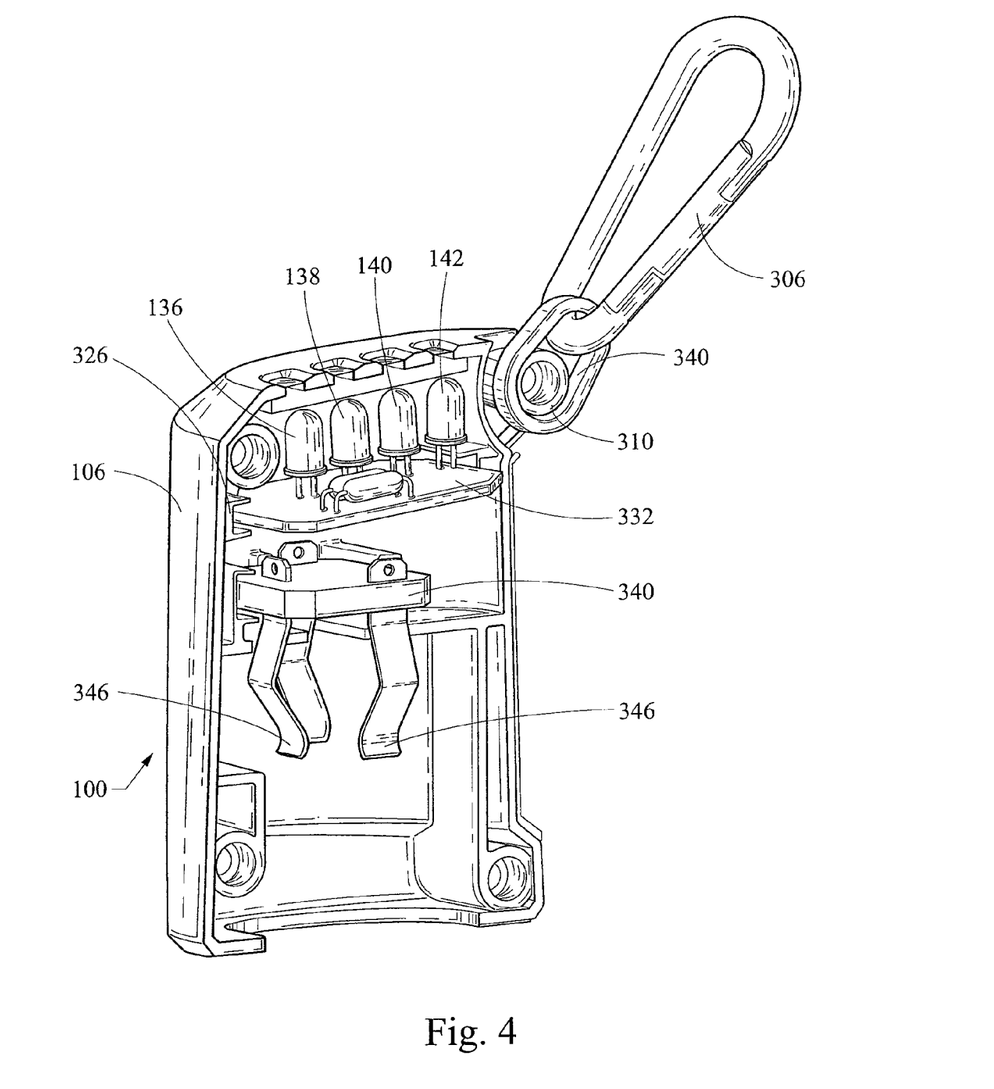
FIG. 4 is an enlarged partial sectional view of the battery tester of FIG. 3.

FIG. 4 shows the partial sectional view of the battery tester 106 in greater detail. In one specific embodiment, the electrode clip holder 340 may include the three electrode clips or contacts 346, where each electrode clip may be separated from the adjacent electrode clip by about ninety degrees. In some embodiments, only two electrode clips may be provided. The electrode clips 346 may be formed of spring steel or other metal capable of flexing and maintaining its shape under deformation.

Each electrode clip 340 may be bent in the form of a "V" or may be curved so as to be able to be displaced by a distal portion of the battery stem 206 as the battery tester 106 receives the battery stem. The electrode clips or contacts 346 may have any suitable shape or geometric configuration. The stiffness of the metal and the geometric arrangement of the electrode clips 346 may determine the amount of friction between the electrode clips 340 and the battery stem 206, and hence the amount of force required to remove the battery tester 106 from the battery stem. As explained above, a frictional force that permits single-handed operation is preferred.

Figure 5A:
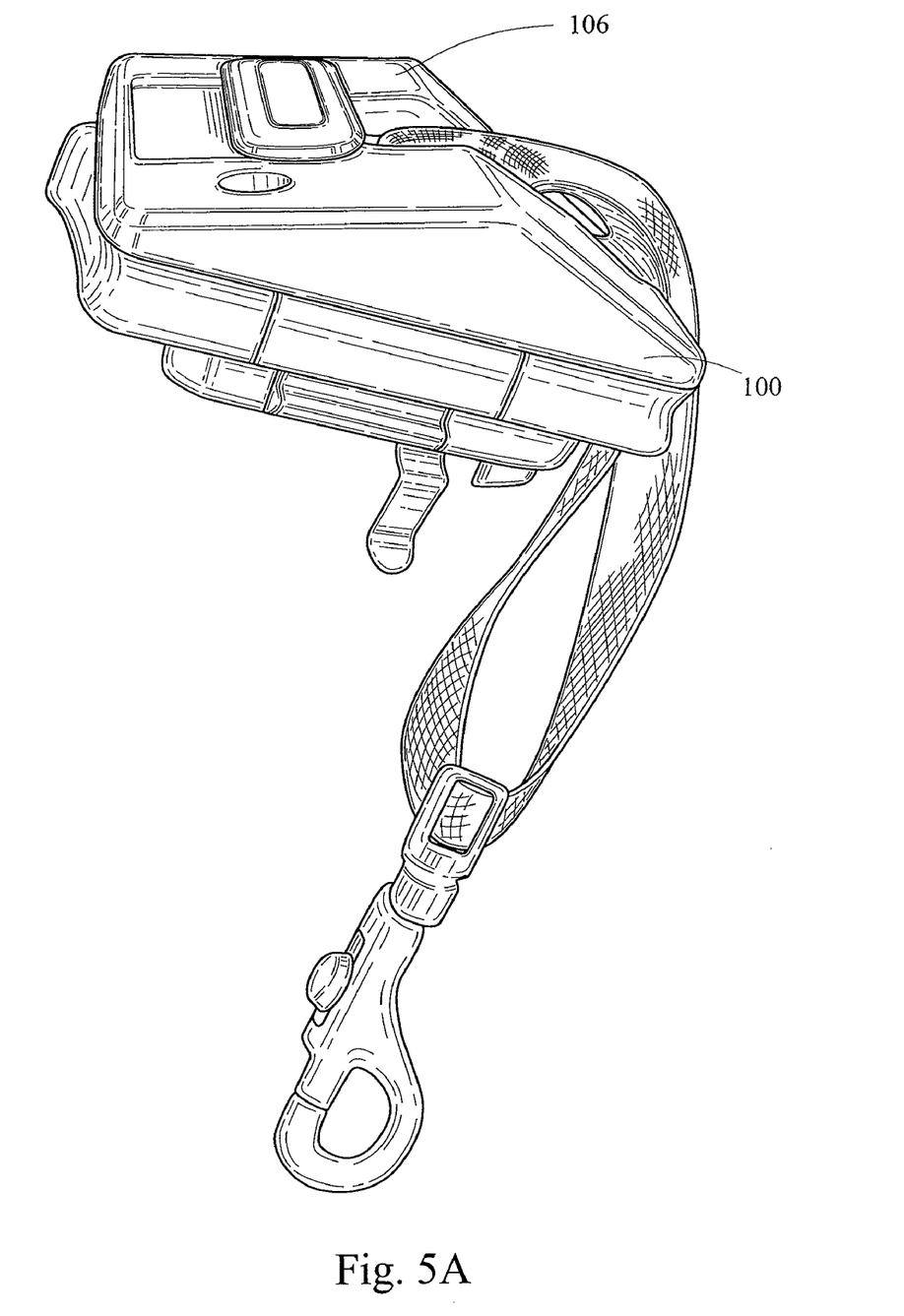
FIG. 5A is a perspective view of a battery tester with a lanyard.
Figure 5B:
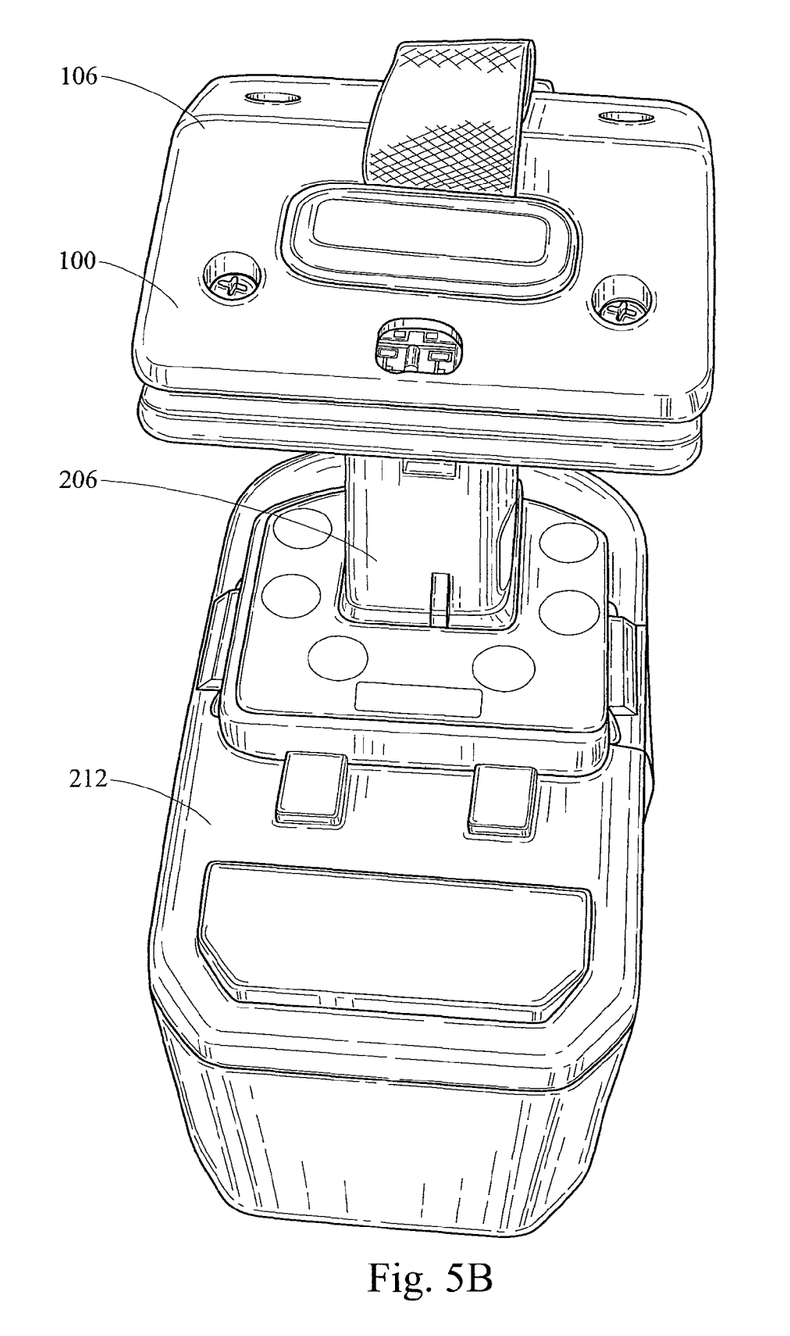
FIG. 5B is a perspective view of the battery tester of FIG. 5A in operation.

FIGS. 5A and 5B show an alternate embodiment of the battery tester with a lanyard. The battery tester form is not limited to a generally rectangular shape shown in FIG. 1, and any suitable shape may be adopted. FIG. 5A is a perspective view of the battery tester 100, while FIG. 5B shows the battery tester engaging the stem 206 of the power tool battery 212. The housing 106 of the battery tester 100 may have a relatively flat or "pancake" appearance. The thickness dimension of the housing 106 is sufficient to provide a cavity capable of receiving the stem of the power tool battery 212. This configuration may be convenient for construction workers, and may permit the worker to carry the battery tester about a job site, where the battery tester may be quickly and easily attached to a tool belt via a clip or lanyard, or hung on a peg or hook. The circuitry of the battery tester of FIG. 5A may be similar or identical to the circuitry described in reference to FIGS. 1-4 and 7-8.

Figure 6A:
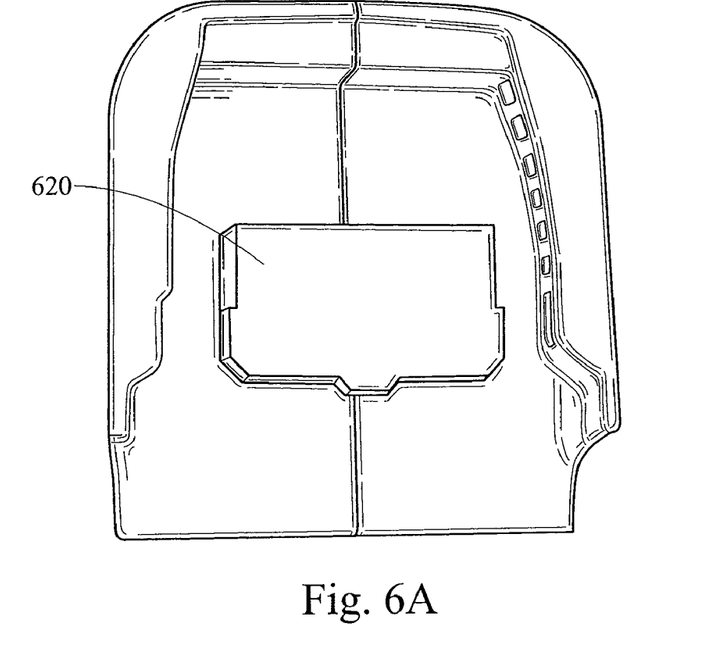
FIG. 6A is a perspective view of a slide-type battery.
Figure 6B:
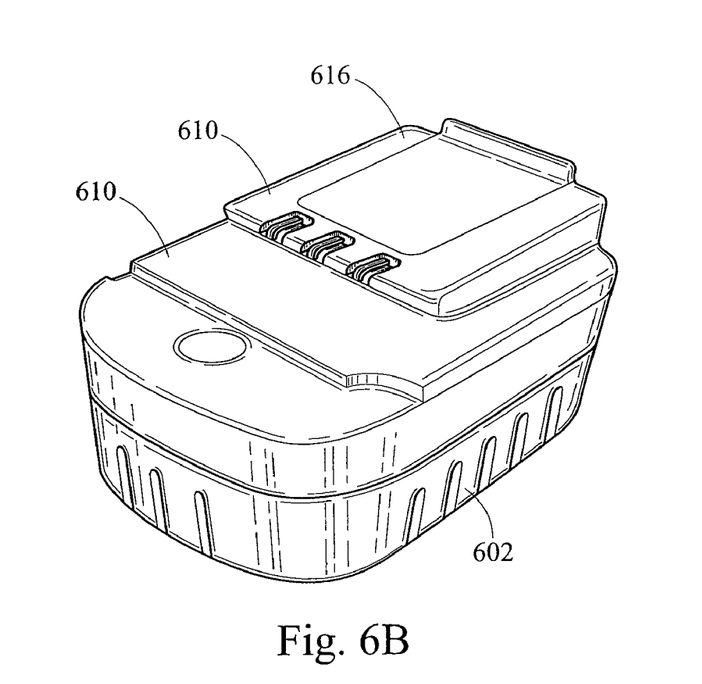
FIG. 6B is a perspective view of one embodiment of a battery tester configured to engage a slide-type battery.

The battery tester is not limited to engaging stem-type batteries, and may also engage a "slide-type" power tool battery 602. FIG. 6 shows a specific embodiment of the battery tester engaging a slide-type battery 602. The slide-type power tool battery 602 includes a housing and a plurality of battery terminals 610 partially covered by a protective shell 616. The battery tester includes a connector 620 configured to slidingly receive and mate with the battery terminals 610. The circuitry of the battery tester of FIG. 6A may be similar or identical to the circuitry described in reference to FIGS. 1-4 and 7-8.

Figure 7:
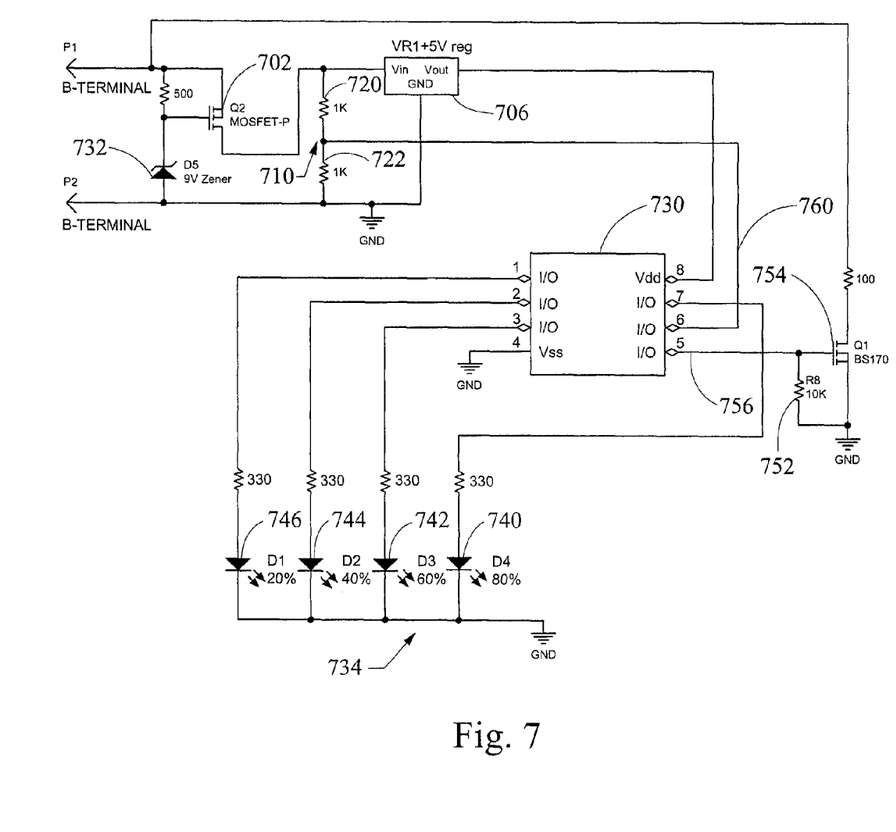
FIG. 7 is a schematic diagram of a battery tester circuit according to one specific embodiment.

FIG. 7 is a schematic diagram of a specific embodiment of the battery tester circuitry. The circuit may include a transistor 702 coupled between a positive battery terminal (B+) and a 5 volt regulator 706. A voltage divider 710, which includes a first resistor 720 and a second resistor 722, is coupled between the positive battery terminal (B+) and the negative or ground battery terminal (B−). The 5 volt regulator 706 may supply power to a processor chip 730, which may be a mixed-signal array processor chip. The mixed-signal array processor chip 730 may be, for example, Model No. CY8C27143, which is commercially available from Cypress Semiconductor Corp. However, any suitable processor may be used, such as a single-chip processor, multi-chip components, and the like. Such devices may include memory, a processing unit, a configurable analog-to-digital converter, a configurable digital-to-analog converter, and a port controller. The processor is not limited to a chip or integrated circuit. Circuitry for determining comparative voltage levels and/or for determining the remaining battery may be formed from discrete components, such as resistors, capacitors, diodes, logic gates (AND, OR, XOR etc.), transistors, or other any suitable components. Such components may be used in place of an integrated processor chip and are interchangeable therewith.

A Zener diode 732 turns off the transistor 702 if the battery voltage falls below about 9 volts, which is the Zener threshold voltage. When the transistor 702 is turned off, power to the 5 volt regulator 706 and power to all portions of the circuit is turned off. Accordingly, in the illustrated embodiment, the battery tester circuit operates when the battery voltage is above the Zener threshold voltage of about 9 volts. However, any suitable Zener diode may be used to vary the Zener threshold voltage depending upon the application and the specific battery to be tested.

The voltage divider 710 divides the battery voltage by a factor of about twelve (1K/12K), and provides the scaled voltage to an input port of the processor chip 730. Any suitable scaling factor may be used depending on the resolution of the processor chip circuitry. Depending upon the input voltage range of the processor chip 730, different scaling factors may be used. In some applications, a divider may not be included, for example, if the processor chip input port can accept the maximum battery voltage level.

In one specific embodiment, the processor chip 730 may drive four separate light-emitting diodes 734 (LEDs), for example, a green LED 740, a blue LED 742, a yellow LED 744, and red LED 746. Any suitable number and colors of LEDs may be used depending on the application. The LEDs 734 may provide the user with a visual indication of the remaining battery charge or remaining battery life. The processor chip 730 may determine the percentage of battery charge based on the scaled voltage level at the input port. For example, the green LED 740 may indicate about an 80% charge or greater, the blue LED 742 may indicate about a 60% charge, the yellow LED 744 may indicate about a 40% charge, and the red LED 746 may indicate about a 20% charge or less. The percentage ranges may vary in other embodiments. In other embodiments, the LEDs may also be arranged in a "bar chart" configuration to indicate the level of charge.

In some embodiments, the testing circuitry and the LED indicators 734 may be built into a power tool battery. In further embodiments, a single multi-color LED may be provided that indicates the battery charge depending on the illumination color. The multi-color LED may, for example, be configured to provide three or four different colors, where each color corresponds to a specific battery charge range.

Battery power may be supplied to the circuit when the battery tester engages the battery stem electrodes of the battery, such as a power tool battery. When power is provided via the battery electrodes (B+ and B−), at a voltage greater than the Zener threshold, the transistor 702 turns on, and the voltage regulator 706 supplies regulated power to the processor chip 730. To place the battery under load, the processor chip 730 may couple a load resistor 752 across the battery terminals (B+ and B−). The processor chip 730 may activate a load coupling transistor 754 by outputting a signal on an output port 756 of the processor chip 730, which effectively places the load resistor 752 between the positive battery terminal (B+) and ground (B−).

Through a read port or input port 760, the processor chip 730 may "read" the input voltage while the battery is under load, for example for between about one and five seconds. After a period of about one to five seconds, the processor chip 730 may turn off the load coupling transistor 754 and unload the battery. Based on the input voltage read by the processor chip 730, and based on the scaling factor of the voltage divider 710, the processor chip may determine the actual voltage of the battery. The measured battery voltage may be compared to a "curve" or "chart" residing in the memory of the processor chip 730 to determine the remaining battery life. Based on the measured voltage and results of the curve comparison, the processor chip illuminates the appropriate LED or series of LEDs to show the level of charge or remaining life of the battery (for that particular charge). After a predetermined period of time, for example, ten seconds, the processor chip turns off the LEDs. This may conserve battery power should the battery tester inadvertently remain engaged with the power tool battery.

Figure 8:
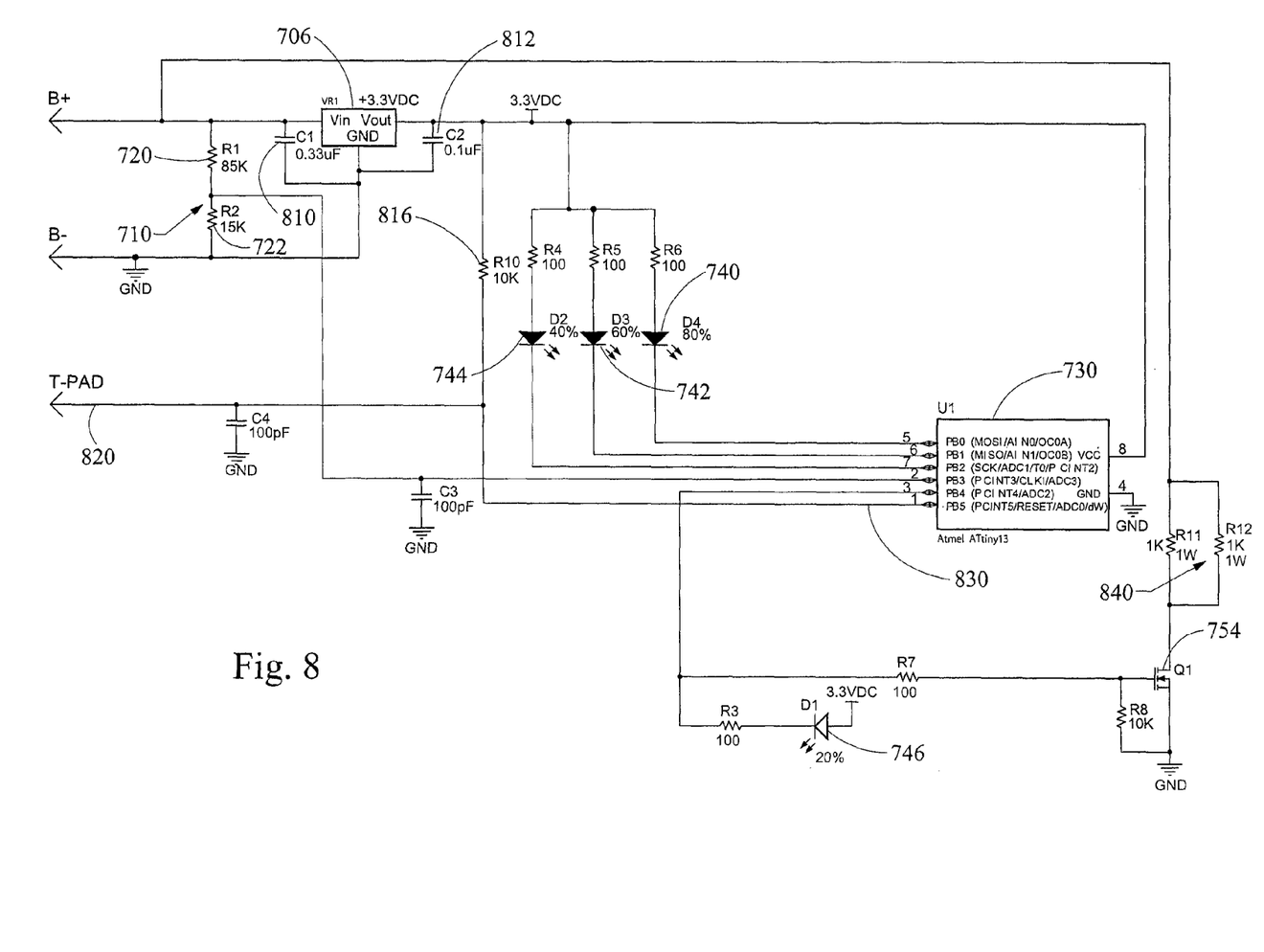
FIG. 8 is a schematic diagram of a battery tester circuit according to another embodiment.

FIG. 8 is an alternate embodiment of the battery tester circuit. The circuit of FIG. 8 may be similar to the circuit of FIG. 7 and may have components in common, where like reference numbers may be used to denote like structures or components. In FIG. 8, the voltage divider 710 may be coupled directly across the positive battery terminal (B+) and the negative (B−) or ground battery terminal. Note that in this specific embodiment, the circuit receives power as long as it is coupled to the battery stem.

A first filter capacitor 810 may smooth the input voltage provided to the voltage regulator 706, and a second filter capacitor 812 may smooth the output voltage provided by the voltage regulator. A battery ID resistor 816 may be coupled to an input of the processor chip 730 and to a T-pad terminal 820. The T-pad terminal 820 contacts a third stem electrode of the battery when the battery tester engages the battery. The T-pad terminal 820 permits identification of the battery type, that is, whether the battery is a nickel-cadmium battery or a lithium-ion battery. Because the T-pad terminal 820 is coupled to an ID-input 830 of the processor chip 730, the processor chip "knows" the type of battery that is being measured, and illuminates the appropriate LEDs based on the voltage-to-lifetime curves of the particular type of battery.

The battery may be placed under load by the parallel combination of load resistors 840 to provide a load with higher power dissipation. In some embodiments, the processor chip 730 may load the battery by turning the loading transistor 754 on and off at a predetermined duty cycle, for a predetermined period of time, for example, one to five seconds. Turning the loading transistor 754 on and off also causes the red LED 746 to turn on and off or blink, which may provide the user with an indication that the battery tester is performing its measurements. At the end of the battery loading period, the processor chip 730 may sample the scaled voltage generated by the voltage divider 710. The battery voltage may be scaled by the voltage divider 710 by any suitable scaling factor based on the input voltage range of the processor chip 730.

Note that while the battery tester of FIG. 8 may be configured to test the voltage of a specific battery, for example, a 18 volt battery, the value of the components may be adjusted to test a different voltage battery, for example, a 14.4 volt battery. In an alternate embodiment, the battery tester may include a switch or other selector to permit the user to choose the specific type of battery to measure, such as a 9.6 volt battery, a 14.4 volt battery, an 18 volt battery, a 24 volt battery, or any power tool battery.

While the invention has been illustrated and described in detail in the drawings and foregoing description, the same is to be considered as illustrative and not restrictive in character, it being understood that only exemplary embodiments have been shown and described and do not limit the scope of the invention in any manner. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

We claim:

1. A battery tester configured to engage a stem of a power tool battery, the battery tester comprising:
    a housing having a cavity configured to receive the stem of the power tool battery;
    a plurality of electrically conductive contacts disposed in the cavity, the contacts configured to biasingly engage corresponding battery electrodes on the stem;
    a processor mounted within the housing in communication with the battery through the electrically conductive contacts, the processor configured to measure a voltage level of the battery;
    a loading circuit configured to electrically load the battery;
    one or more indicators disposed on or in the housing and controlled by the processor;
    wherein the processor is configured to activate the loading circuit for a predetermined period of time to measure a voltage level of the battery while under load, and activate the indicators to provide a visual indication of remaining battery life; and
    wherein the housing lacks a motor and a battery charger therein.

2. The battery tester of claim 1, wherein the contacts are configured to be urged against the battery electrodes and/or the battery stem with a predetermined amount of force to create a frictional fit between the conductive contacts and the stem.

3. The battery tester of claim 2, wherein an amount of force needed to remove the battery tester from the battery stem is less than the weight of the battery.

4. The battery tester of claim 2, wherein the battery tester is disengaged from the battery stem while the battery is resting on a surface, by a user using a single hand without lifting the battery from the surface.

5. The battery tester of claim 1, wherein the processor is activated when the conductive contacts engage the battery electrodes.

6. The battery tester of claim 1, further comprising a voltage divider configured to provide a scaled voltage signal to an input of the processor, wherein the scaled signal is proportional to a supply voltage of the battery.

7. The battery tester of claim 1, further comprising:
    a regulated power supply configured to provide regulated power to the processor;
    a transistor configured to receive a supply voltage from the battery and provide the supply voltage to an input of the regulated power supply; and
    a Zener diode coupled to a gate of the transistor and configured to turn off the transistor and disconnect the supply voltage from the input of the regulated power supply if the supply voltage falls below a predetermined voltage level.

8. The battery tester of claim 1, wherein the loading circuit further comprises:
    a load switch operatively coupled to the processor;
    a load coupled between a supply voltage of the battery and the switch; and
    wherein the processor activates the load switch for a predetermined period of time to operatively couple the load between the supply voltage of the battery and ground so as to load the battery.

9. The battery tester of claim 8, wherein the processor is configured to measure the supply voltage of the battery while the load is coupled between the battery and ground.

10. The battery tester of claim 1, wherein the processor activates the indicators to provide the visual indication of remaining battery life, and deactivates the indicators after a predetermined period of time.

11. The battery tester of claim 1, further comprising a plurality of light-emitting diodes, wherein illumination of the respective light-emitting diodes indicates a predetermined percentage of remaining battery life.

12. The battery tester of claim 1, wherein the electrically conductive contacts have an arcuate or "V" shape and are configured to springingly flex when contacted by a peripheral portion of the stem.

13. The battery tester of claim 1, further comprising an audio transducer configured to provide an audio indication of remaining battery life.

14. A stand-alone battery tester configured to engage a slide-type power tool battery, the battery tester comprising:
- a housing having a connector configured to slidingly receive battery terminals of the slide-type power tool battery;
- a plurality of electrically conductive contacts disposed in the connector, the conductive contacts configured to biasingly engage the corresponding battery terminals;
- a processor mounted within the housing in communication with the battery through the electrically conductive contacts, and configured to measure a voltage level of the battery;
- a loading circuit configured to electrically load the battery;
- one or more indicators disposed on or in the housing and controlled by the processor;
- wherein the processor is configured to activate the loading circuit for a predetermined period of time and measure a voltage level of the battery while under load, and activate the indicators to provide a visual indication of remaining battery life; and
- wherein the housing lacks a motor and a battery charger therein.

15. The battery tester of claim 14, wherein the processor is activated when the conductive contacts engage the battery electrodes.

16. The battery tester of claim 14, further comprising a voltage divider configured to provide a scaled voltage signal to an input of the processor, wherein the scaled signal is proportional to a supply voltage of the battery.

17. The battery tester of claim 14, further comprising:
- a regulated power supply configured to provide regulated power to the processor;
- a transistor configured to receive a supply voltage from the battery and provide the supply voltage to an input of the regulated power supply; and
- a Zener diode coupled to a gate of the transistor and configured to turn off the transistor and disconnect the supply voltage from the input of the regulated power supply if the supply voltage falls below a predetermined voltage level.

18. The battery tester of claim 14, wherein the loading circuit further comprises:
- a load switch operatively coupled to the processor;
- a load coupled between a supply voltage of the battery and the switch; and
- wherein the processor activates the load switch for a predetermined period of time to operatively couple the load between the supply voltage of the battery and ground so as to load the battery.

19. The battery tester of claim 14, wherein the processor is configured to measure the supply voltage of the battery while the load is coupled between the battery and ground.

20. The battery tester of claim 14, wherein the processor activates the indicators to provide the visual indication of remaining battery life, and deactivates the indicators after a predetermined period of time.

21. The battery tester of claim 14, further comprising a plurality of light-emitting diodes, wherein illumination of the respective light-emitting diodes indicates a predetermined percentage of remaining battery life.

22. The stand-alone battery tester of claim 14, further comprising an audio transducer configured to provide an audio indication of remaining battery life.

23. A battery tester configured to engage a stem of a power tool battery, the battery tester comprising:
- a housing having a cavity configured to receive the stem of the power tool battery;
- a plurality of electrically conductive contacts disposed in the cavity, the contacts configured to biasingly engage corresponding battery electrodes on the stem;
- a processor mounted within the housing in communication with the battery through the electrically conductive contacts;
- a voltage divider configured to provide a scaled voltage signal to an input of the processor, the scaled voltage signal corresponding to remaining battery life;
- a loading circuit configured to electrically load the battery;
- one or more indicators disposed on or in the housing and controlled by the processor;
- wherein the processor is configured to activate the loading circuit for a first predetermined period of time to measure a voltage level of the battery while under load;
- wherein the processor is configured to activate the indicators to provide a visual indication of remaining battery life, and deactivate the indicators after a second predetermined period of time; and
- wherein the housing lacks a motor and a battery charger therein.

24. The battery tester of claim 23, wherein the contacts are urged against the battery electrodes and/or the battery stem with a predetermined amount of force to create a frictional fit between the conductive contacts and the stem.

25. The battery tester of claim 24, wherein an amount of force needed to remove the battery tester from the battery stem is less than the weight of the battery.

26. The battery tester of claim 24, wherein the battery tester is disengaged from the battery stem while the battery is resting on a surface, by a user using a single hand without lifting the battery from the surface.

* * * * *